(12) United States Patent
Fan et al.

(10) Patent No.: US 11,257,747 B2
(45) Date of Patent: Feb. 22, 2022

(54) SEMICONDUCTOR PACKAGE WITH CONDUCTIVE VIA IN ENCAPSULATION CONNECTING TO CONDUCTIVE ELEMENT

(71) Applicant: Powertech Technology Inc., Hsinchu County (TW)

(72) Inventors: Wen-Jeng Fan, Hsinchu County (TW); Shang-Yu Chang Chien, Hsinchu County (TW); Nan-Chun Lin, Hsinchu County (TW); Hung-Hsin Hsu, Hsinchu County (TW)

(73) Assignee: Powertech Technology Inc., Hsinchu County (TW)

(*) Notice: Subject to any disclaimer, the term of this patent is extended or adjusted under 35 U.S.C. 154(b) by 97 days.

(21) Appl. No.: 16/382,229

(22) Filed: Apr. 12, 2019

(65) Prior Publication Data
US 2020/0328144 A1  Oct. 15, 2020

(51) Int. Cl.
*H01L 23/498* (2006.01)
*H01L 23/31* (2006.01)
*H01L 21/56* (2006.01)
*H01L 21/48* (2006.01)
*H01L 23/66* (2006.01)

(52) U.S. Cl.
CPC ...... *H01L 23/49838* (2013.01); *H01L 21/486* (2013.01); *H01L 21/4857* (2013.01); *H01L 21/56* (2013.01); *H01L 21/568* (2013.01); *H01L 23/3128* (2013.01); *H01L 23/49816* (2013.01); *H01L 23/49822* (2013.01); *H01L 23/49827* (2013.01); *H01L 23/66* (2013.01); *H01L 2223/6677* (2013.01); *H01L 2225/06548* (2013.01)

(58) Field of Classification Search
CPC ....... H01L 2225/06548; H01L 23/5389; H01L 2924/18162; H01L 2225/1035; H01L 2225/73209; H01L 2225/92124
See application file for complete search history.

(56) References Cited

U.S. PATENT DOCUMENTS

| 8,624,374 B2 | 1/2014 | Ding et al. |
| 9,136,220 B2* | 9/2015 | Uchiyama ......... H01L 23/49822 |
| 9,293,406 B2* | 3/2016 | Chino ............... H01L 23/49827 |

(Continued)

FOREIGN PATENT DOCUMENTS

| CN | 103904057 | 7/2014 | |
| CN | 103904057 A * | 7/2014 | ............. H01L 24/19 |

(Continued)

*Primary Examiner* — Daniel Luke
(74) *Attorney, Agent, or Firm* — JCIPRNET

(57) ABSTRACT

A semiconductor package including a semiconductor chip, a conductive element disposed aside the semiconductor chip, a conductive via disposed on and electrically connected to the conductive element, an insulating encapsulation, and a first circuit structure disposed on the semiconductor chip and the conductive via is provided. A height of the conductive element is less than a height of the semiconductor chip. The insulating encapsulation encapsulates the semiconductor chip, the conductive element, and the conductive via. The conductive via is located between the first circuit structure and the conductive element, and the semiconductor chip is electrically coupled to the conductive via through the first circuit structure.

5 Claims, 11 Drawing Sheets

(56) References Cited

U.S. PATENT DOCUMENTS

| | | | |
|---|---|---|---|
| 9,443,797 B2* | 9/2016 | Marimuthu | H01L 24/02 |
| 10,504,825 B2* | 12/2019 | Lee | H01L 24/13 |
| 10,854,531 B2* | 12/2020 | Chew | H01L 21/4846 |
| 10,867,919 B2* | 12/2020 | Tsai | H01L 21/56 |
| 2018/0277485 A1 | 9/2018 | Han et al. | |
| 2019/0051590 A1* | 2/2019 | Fang | H01L 24/82 |

FOREIGN PATENT DOCUMENTS

| | | |
|---|---|---|
| TW | 201814861 | 4/2018 |
| TW | 201830649 | 8/2018 |
| TW | 201911496 | 3/2019 |

\* cited by examiner

SEMICONDUCTOR PACKAGE WITH CONDUCTIVE VIA IN ENCAPSULATION CONNECTING TO CONDUCTIVE ELEMENT

BACKGROUND OF THE INVENTION

1. Field of the Invention

The present invention generally relates to a package structure and a manufacturing method thereof, and more particularly, to a semiconductor package and a manufacturing method thereof.

2. Description of Related Art

In recently years, electronic apparatus are more important for human's life. In order for electronic apparatus design to achieve being light, slim, short, and small, semiconductor packaging technology has kept progressing, in attempt to develop products that are smaller in volume, lighter in weight, higher in integration, and more competitive in market. Since the chip package technique is highly influenced by the development of integrated circuits, therefore, as the size of electronics has become demanding, so does the package technique. As such, miniaturizing the semiconductor package and keeping the reliability of the semiconductor package while maintaining the process simplicity has become a challenge to researchers in the field.

SUMMARY OF THE INVENTION

The disclosure provides a semiconductor package and a manufacturing method thereof, which improves the reliability of the semiconductor package and the processing yield.

The disclosure provides a semiconductor package including a semiconductor chip, a conductive element disposed aside the semiconductor chip, a conductive via disposed on and electrically connected to the conductive element, an insulating encapsulation, and a first circuit structure disposed on the semiconductor chip and the conductive via. A height of the conductive element is less than a height of the semiconductor chip. The insulating encapsulation encapsulates the semiconductor chip, the conductive element, and the conductive via. The conductive via is located between the first circuit structure and the conductive element, and the semiconductor chip is electrically coupled to the conductive via through the first circuit structure.

The disclosure provides a semiconductor package including a semiconductor chip, a conductive element disposed aside the semiconductor chip, an interconnecting circuitry disposed on the semiconductor chip and the conductive element, and an insulating encapsulation encapsulating the semiconductor chip and the conductive element. The semiconductor chip is electrically coupled to the conductive element through the interconnecting circuitry. The interconnecting circuitry includes a first conductive via in contact with the conductive element, and a second conductive via in contact with the semiconductor chip. The interconnecting circuitry is inlaid in the insulating encapsulation.

The disclosure provides a manufacturing method of a semiconductor package. The method includes at least the following steps. An insulating encapsulation is formed to encapsulate a semiconductor chip and a conductive element disposed adjacent to the semiconductor chip, where a first surface of the semiconductor chip is exposed by the insulating encapsulation, and the insulating encapsulation comprises a first via hole exposing at least a portion the conductive element. A first conductive via is formed in the first via hole of the insulating encapsulation to be in contact with the conductive element. A first circuit structure is formed on the first surface of the semiconductor chip, the first conductive via, and the insulating encapsulation, so that the first circuit structure is electrically couple to the semiconductor chip and the first conductive via.

Based on the above, the semiconductor package includes the conductive via formed on the conductive element and embedded in the insulating encapsulation so that the surface of the conductive element and the active surface of the semiconductor chip are not at the same level, thereby facilitating the efficiency of insulating material's thinning process. In addition, the pitch between two adjacent conductive vias can be adjusted to meet the fine-pitch requirements of the circuit structure, thereby achieving the high density connections. Moreover, the interconnecting circuitry may be embedded in the insulating encapsulation to be in electrical contact with the semiconductor chip and the conductive element such that a photo-lithography process for forming a redistribution layer connected therebetween may be omitted, thereby saving manufacturing cost.

To make the above features and advantages of the present invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
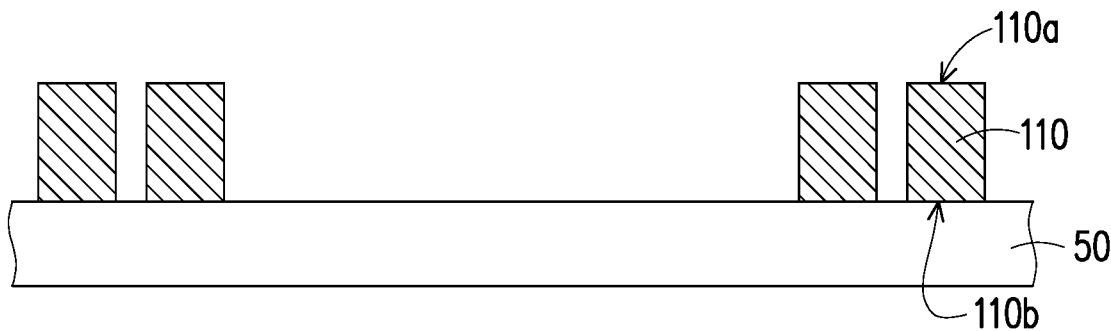
FIG. 1A to FIG. 1H are schematic cross-sectional views illustrating a manufacturing method of a semiconductor package according to an embodiment of the disclosure.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
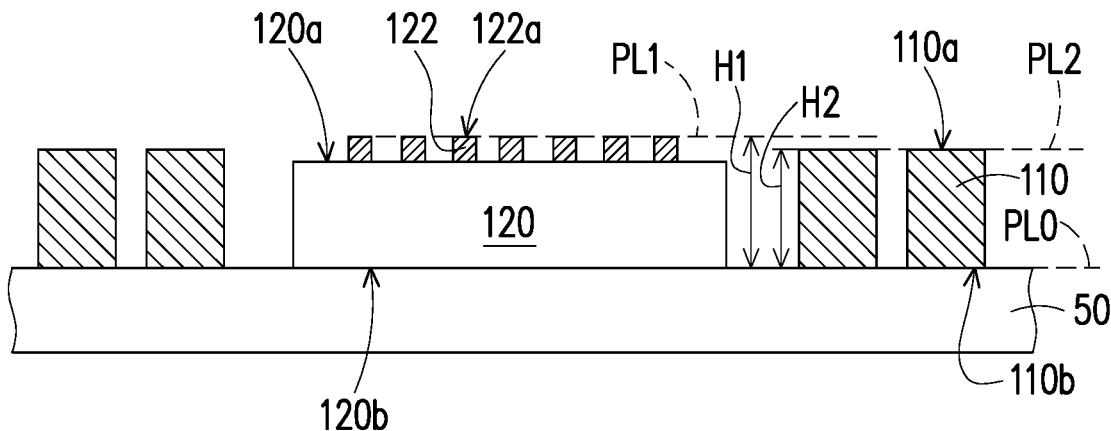
Figure 1C:
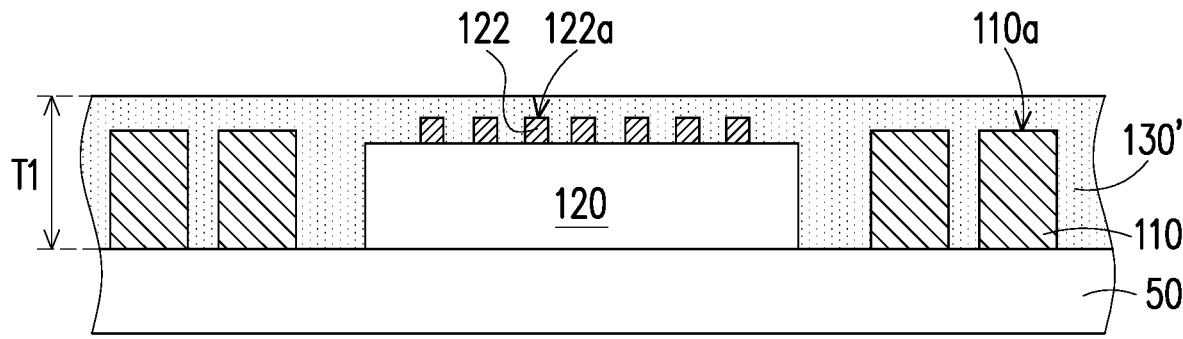
Figure 1D:
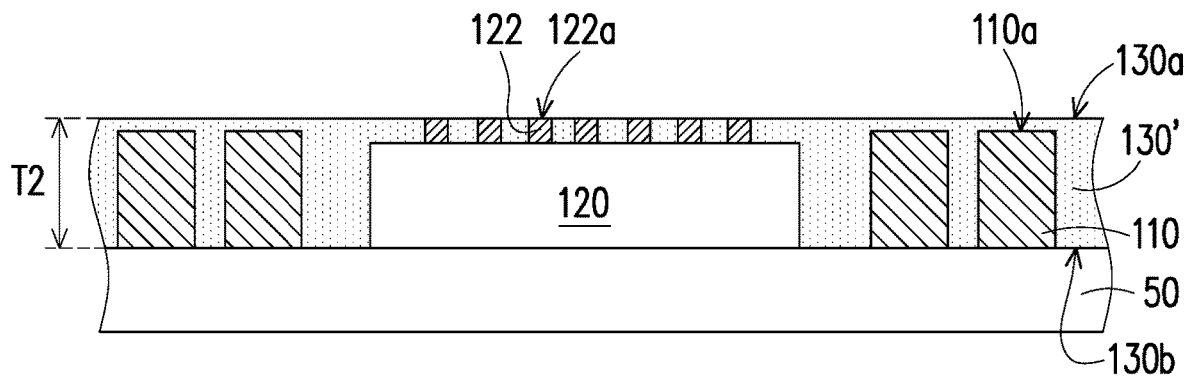
Figure 1E:
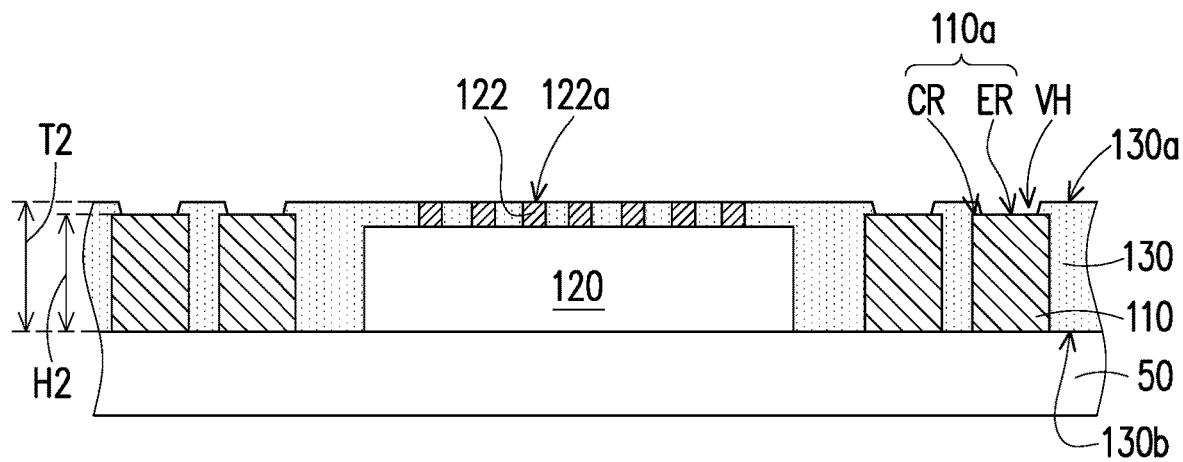
Figure 1F:
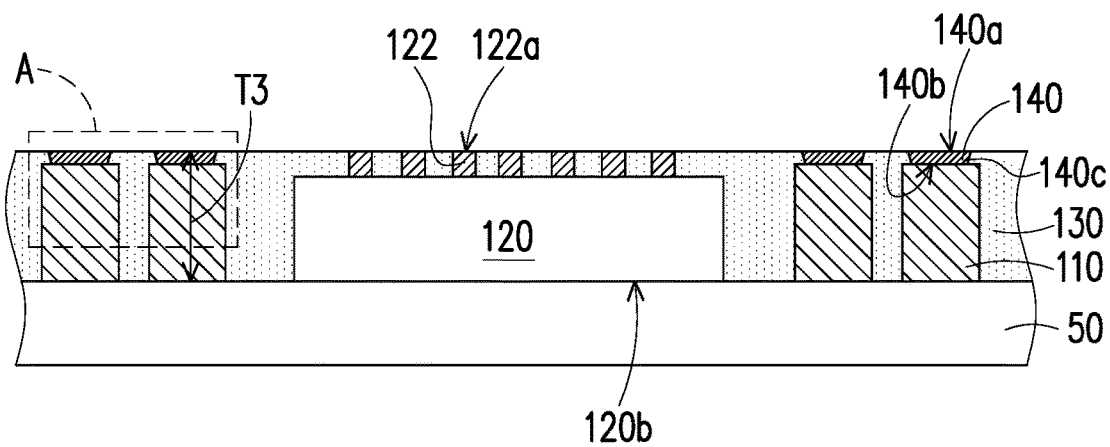
Figure 1G:
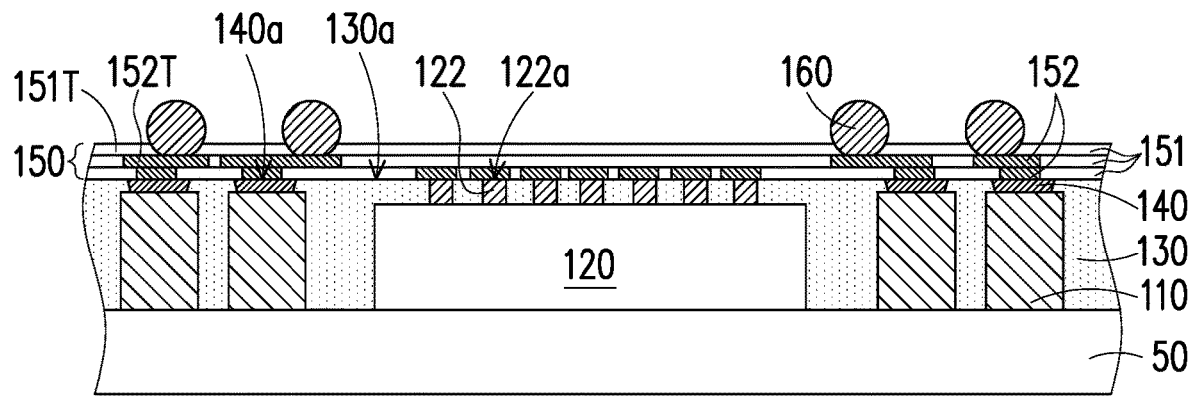
Figure 1H:
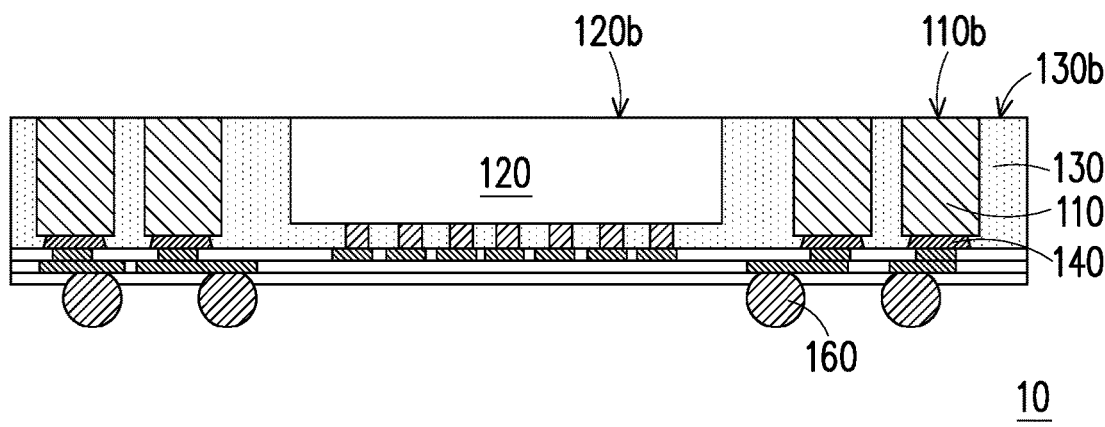
Figure 2:
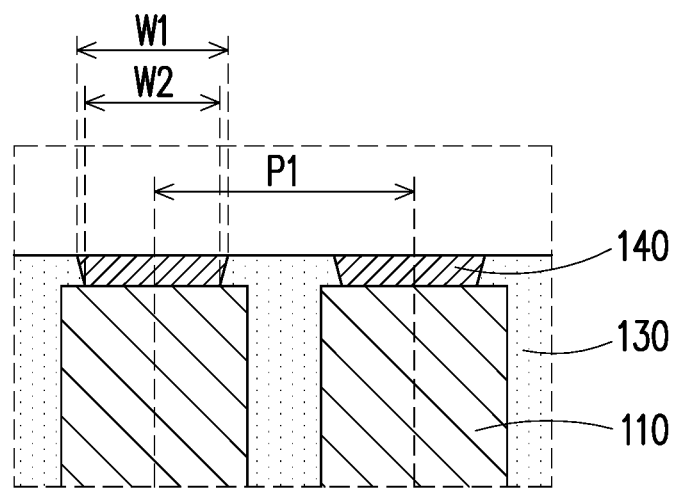
FIG. 2 is a schematic cross-sectional view illustrating the enlarged area A shown in FIG. 1F according to an embodiment of the disclosure.
Figure 3:
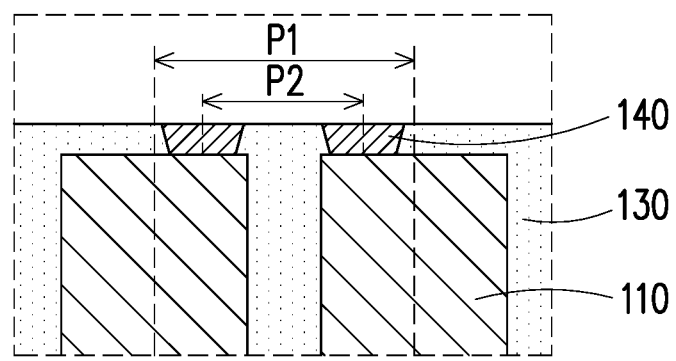
FIG. 3 is a schematic cross-sectional view illustrating the enlarged area A shown in FIG. 1F according to another embodiment of the disclosure.

FIG. 1A to FIG. 1H are schematic cross-sectional views illustrating a manufacturing method of a semiconductor package according to an embodiment of the disclosure, FIG. 2 is a schematic cross-sectional view illustrating the enlarged area A shown in FIG. 1F according to an embodiment of the disclosure, and FIG. 3 is a schematic cross-sectional view illustrating the enlarged area A shown in FIG. 1F according to another embodiment of the disclosure. Referring to FIG. 1A a conductive element 110 is disposed on a temporary carrier 50. The temporary carrier 50 may be made of glass, plastic or other suitable materials as long as the material is able to withstand the subsequent processes while carrying the structure formed thereon. In some embodiments, a de-bonding layer (not shown) is provided between the conductive element 110 and the temporary carrier 50 to enhance the releasibility of the conductive element 110 from the temporary carrier 50 in the subsequent processes. The de-bonding layer may be a LTHC (light to heat conversion) adhesive layer, or other suitable adhesive layers.

The conductive element 110 includes a first surface 110a and a second surface 110b opposite to the first surface 110a. The second surface 110b of the conductive element 110 may be facing toward the temporary carrier 50. A material of the conductive element 110 includes copper, nickel, gold, tin, lead, a combination thereof, or other suitable conductive materials. The conductive element 110 may have the shape of pillars. The top view shape of the conductive element 110 includes circles, rectangles, squares, polygons, or the like. In some embodiments, a plurality of the conductive elements 110 is distributed on the temporary carrier 50. For example, the conductive elements 110 are formed through a plating process (e.g., electro-plating, electroless-plating, immersion plating), or other suitable deposition processes. In alternative embodiments, the pre-formed conductive elements 110 are disposed on the temporary carrier 50 through a pick and place process.

Referring to FIG. 1B, a semiconductor chip 120 is disposed on the temporary carrier 50 adjacent to the conductive element 110 by a pick and place process, or other suitable techniques. In some embodiments, a plurality of the semiconductor chips 120 are arranged on the temporary carrier 50. Each of the semiconductor chips 120 is surrounded by the conductive elements 110. The semiconductor chips 120 may include a memory chip, a logic chip, a calculating chip, an ASIC (Application-Specific Integrated Circuit), or other suitable active devices.

Each semiconductor chip 120 has a first side 120a, and a second side 120b opposite to the first side 120a. The second side 120b may be facing toward the temporary carrier 50. The first side 120a of semiconductor chip 120 may include a plurality of conductive bumps 122. Each conductive bump 122 has a first surface 122a. A material of the conductive bumps 122 include copper, tin, gold, nickel, solder, a combination thereof, or the like. In some embodiments, the semiconductor chip 120 is manufactured by the following steps. First, a wafer (not illustrated) having active components (e.g., transistors or the like) and, optionally, passive components (e.g., resistor, capacitor, inductor, or the like) formed therein is provided. Next, an interconnection structure is formed over the wafer, and then, the conductive bumps 122 are formed over and are electrically connected the interconnection structure. Afterward, the wafer is diced to obtain a plurality of the semiconductor chips 120.

As shown in FIG. 1B, after forming the conductive element 110 and disposing the semiconductor chip 120, a height H1 measured from the first surface 122a of one of the conductive bumps 122 to the second side 120b is greater than a height H2 of one of the conductive element 110 measured from the first surface 110a to the second surface 110b. For example, the reference plane PL0 may be the upper surface of temporary carrier 50 where conductive elements 110 and the semiconductor chip 120 are disposed on, a first plane PL1 may be the first surfaces 122a of the conductive bumps 122, and a second plane PL2 may be the first surfaces 110a of the conductive elements 110. A distance between the first plane PL1 and the reference plane PL0 is greater than a distance between the second plane PL2 and the reference plane PL0. The height H2 of the conductive element 110 may be adjusted depending on the design requirements, which is not limited in the disclosure.

Referring to FIG. 1C, an insulating material 130' is formed over the temporary carrier 50 to cover the conductive elements 110 and the semiconductor chip 120. The insulating material 130' may include polymer, epoxy resin, molding compound, or other suitable electrically insulating materials. For example, the insulating material 130' may be a molding compound formed by molding processes. After forming the insulating material 130', the first surfaces 122a of the conductive bumps 122 and the first surfaces 110a of the conductive elements 110 are covered by the insulating material 130'. A first thickness T1 of the insulating material 130' is greater than the height H2 of the conductive element 110 and the height H1 of the semiconductor chip 120.

Referring to FIG. 1D and FIG. 1E, after forming the insulating material 130', a part of the insulating material 130' is removed to form an insulating encapsulation 130. The insulating encapsulation 130 having a first surface 130a and a second surface 130b opposite to the first surface 130a as shown in FIG. 1D. The first thickness T1 of the insulating material 130' is reduced until the first surfaces 122a of the conductive bumps 122 are accessibly exposed to form the second thickness T2. The thinning process of the insulating material 130' includes a mechanical grinding process, a chemical mechanical polishing (CMP) process, or any other suitable process. The thinning process may be used to planarize the insulating material 130' to provide a substantially planar first surface 130a. In some embodiments, during the thinning process, portions of the conductive bumps 122 of the semiconductor chip 120 may be removed.

As shown in FIG. 1D, after thinning the insulating material 130', the first surface 130a of the insulating material 130' may be substantially coplanar with the first surfaces 122a of the conductive bumps 122. Since the height H1 of the semiconductor chip 120 is higher than the height H2 of the conductive element 110, the first surfaces 110a of the conductive elements 110 may still be embedded within the insulating material 130' after thinning. Since the conductive elements 110 are not grinded or thinned, less resistance is encountered during thinning process. Thus, the thinning process can be performed with ease.

As shown in FIG. 1E, the second thickness T2 of the insulating encapsulation 130 is greater than the height H2 of the conductive element 110. A part of the insulating material 130 is removed to form via holes VH. The via holes VH may be formed through a laser drilling process, lithography and etching processes, or other suitable techniques. The via holes VH may expose at least a portion of the conductive element 110 for further electrical connection. The via hole VH may have an opening area less than the surface area of the first surface 110a of a conductive element 110. Each via hole VH may correspond to one of the conductive elements 110. In alternative embodiments, more than one via holes VH may be formed on one conductive element 110. In alternative embodiments, the via holes VH are formed before thinning the insulating material 130'. The sequence of thinning and forming via holes VH construes no limitation in the disclosure. After forming the via holes, the first surface 110a of the conductive element 110 may have a covered region CR and an exposed region ER. The covered region CR is covered by the insulating encapsulation 130 and the exposed region ER is exposed by the via hole VH. The exposed region ER may be formed at the centre or at the periphery of the first surface 110a, which may depend on the design and will be described later in other embodiments.

Referring to FIG. 1F, FIG. 2 and FIG. 3, after forming the insulating encapsulation 130, a conductive via 140 is formed in the via hole VH of the insulating encapsulation 130 using electroplating, electroless plating, or other suitable deposition process. The conductive vias 140 are in physical contact with the exposed regions ER (shown in FIG. 1E) of the conductive elements 110, and the conductive elements 110 and the conductive vias 140 are electrically connected. A planarization process is optionally performed to remove excess portions of conductive material so that the conductive vias 140 are substantially leveled with the first surface 130a of the insulating encapsulation 130 and the first surfaces 122a of the conductive bumps 122 of the semiconductor chip 120.

Each conductive via 140 may have a substantially tapered profile. Each conductive via 140 has a first surface 140a, a second surface 140b opposite to the first surface 140a, and a sidewall 140c connecting the first surface 140a and the second surface 140b. As shown in FIG. 2, the width W1 of the first surface 140a of the conductive via 140 may be wider than the width W2 of the second surface 140b of the conductive via 140. In other embodiments, the width W1 of the first surface 140a is narrower than the width W2 of the second surface 140b. In alternative embodiments, the conductive via 140 has a pillar profile, and the sidewall 140c of the conductive via 140 may be vertical.

In some embodiments, the size (e.g., length, width, height) of each conductive element 110 is smaller than the size of each conductive via 140 formed thereon. In some embodiments, the height of each conductive via 140 is shorter than the height of each conductive bump 122 of the semiconductor chip 120. In alternative embodiments, the height of each conductive via 140 is greater than (or substantially equal to) the height of each conductive bump 122. After forming the conductive vias 140, a total height T3 of the conductive element 140 and the corresponding conductive via 110 formed thereon is substantially equal to the height from the first surfaces 122a to the second side 120b of the semiconductor chip 120.

Still referring to FIG. 1F with reference to FIG. 2 and FIG. 3, the conductive vias 140 are substantially concentric to the centre of the first surfaces 110a of the conductive elements 110. The pitch P1 between two adjacent conductive vias 140 is substantially equal to the pitch P1 between two adjacent conductive elements 110. The pitch P1 is a centre to centre distance between two adjacent conductive via 140 or a centre to centre distance between two adjacent conductive element 110. A centre of the conductive via 140 may be substantially aligned with a centre of the corresponding conductive element 110 as shown in FIG. 2.

In alternative embodiments, the conductive via 140 is formed in offset with the centre of the corresponding conductive element 110. The conductive via 140 may be formed on the periphery of a first surface 110a of a conductive element 110. An adjacent conductive via 140 may be formed on the periphery of a first surface 110a of another conductive elements 110. In some embodiment, the pitch P2 between two adjacent conductive vias 140 may be less than the pitch P1 between two adjacent conductive elements 110 as shown in FIG. 3. The pitch between two adjacent conductive vias 140 can be adjusted to meet the fine-pitch requirements of the subsequently formed redistribution structure, thereby achieving the high density connections. In another embodiment the pitch between two adjacent conductive vias 140 may be greater than the pitch P1 between two adjacent conductive elements 110 depending on the position of the adjacent conductive vias 140.

Referring to FIG. 1G, a redistribution structure (i.e. first circuit structure) 150 is formed over the first surface 130a of the insulating encapsulation 130, the first surfaces 140a of the conductive vias 140, and the first surfaces 122a of the conductive bumps 122. The redistribution structure 150 is electrically coupled to the semiconductor chip 120 and the conductive vias 140. The redistribution structure 150 includes at least one patterned dielectric layer 151 and at least one patterned conductive layer 152 alternatingly formed. A first patterned conductive layer 152 of the redistribution structure 150 may be directly in contact and electrically coupled to the conductive vias 140 and the conductive bumps 122 of the semiconductor chip 120. The patterned dielectric layer 151 may be made of inorganic or organic semiconductor dielectric materials such as polybenzoxazole (PBO), polyimide (PI), benzocyclobutene (BCB), or other suitable electrically insulating materials. The patterned dielectric layer 151 may be formed using any suitable method, such as a coating process, a deposition process, or the like. The patterned dielectric layer 151 includes a plurality of openings exposing portions of the conductive vias 140 and portions of the conductive bumps 122. Subsequently, the patterned conductive layer 152 may be formed in and over the patterned dielectric layer 151. The patterned conductive layer 152 includes conductive features such as conductive traces, contact pads, and/or contact vias. A material of the patterned conductive layer 152 includes copper, aluminum, metal alloy, or combinations thereof. In alternative embodiments, the patterned conductive layer 152 is formed prior to the patterned dielectric layer 151. The process may be performed multiple times to form a multi-layered redistribution structure as required by the circuit design.

After forming the redistribution structure 150, a conductive terminal 160 is formed on the redistribution structure 150. The top patterned dielectric layer 151T may have openings exposing at least a portion of the top patterned conductive layer 152 (e.g., under-ball metallurgy (UBM) pads). A material of the top patterned dielectric layer 151T may be different from the underlying patterned dielectric layers. The top patterned dielectric layer 151T may include solder sensitive material for protecting the patterned conductive layer 152 during a ball mounting process. The conductive terminals 160 are formed in the openings of the top patterned dielectric layer 151T to be in physical contact with the underlying top patterned conductive layer 152. The conductive terminals 160 may include conductive balls, conductive pillars, conductive bumps, a combination thereof, or other forms and shapes formed by a ball mounting process, an electroless plating process, or other suitable process. A soldering process and a reflowing process are optionally performed for enhancement of the adhesion between the conductive terminals 160 and the redistribution structure 150.

Referring to FIG. 1H, after forming the conductive terminals 160, the temporary carrier 50 is removed to expose the semiconductor chip 120, the conductive elements 110, and the insulating encapsulation 130. After removing the temporary carrier 50, the second side 120b of the semiconductor chip 120 is substantially coplanar with the second surfaces 110b of the conductive elements 110 and the second surface 130b of the insulating encapsulation 130. A singulation process may be performed to form a plurality of semiconductor package 10. As shown in FIG. 1H, the semiconductor chip 120 is disposed on the redistribution structure 150, and each conductive via 140 is between the redistribution structure 150 and the conductive element 110. The conductive element 110 and the corresponding conductive via 140 are electrically coupled to the semiconductor chip 120 through the redistribution structure 150. The insulating encapsulation 130 disposed on the redistribution structure 150 laterally encapsulates the semiconductor chip 120, the conductive element 110, and the conductive via 140. The conductive terminals 160 are disposed on the redistribution structure 150 opposite to the insulating encapsulation 130 for further electrical connection.

Figure 4:
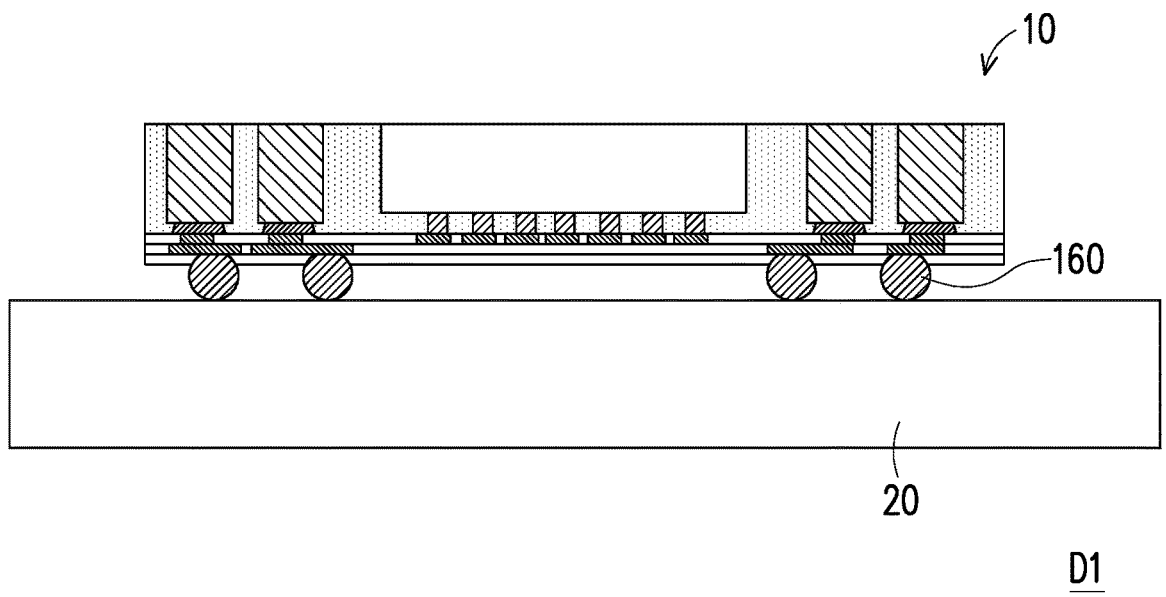
FIG. 4 is a schematic cross-sectional view illustrating an application of semiconductor package according to an embodiment of the disclosure.

FIG. 4 is a schematic cross-sectional view illustrating an application of semiconductor package according to an embodiment of the disclosure. The identical or similar numbers refer to the identical or similar elements throughout the drawings, and detail thereof is not repeated. Referring to FIG. 4, the semiconductor package 10 is disposed on a circuit substrate 20 to form an electronic device D1. The circuit substrate 20 may be a package substrate having integrated circuit (IC) therein, a printed circuit board (PCB), or other suitable electronic components. The conductive terminals 160 of the semiconductor package 10 may be utilized to establish electrical connections between the semiconductor package 10 and the circuit substrate 20, thereby providing the electronic device D1 of high quality and reliability. For example, the semiconductor package 10 is placed on the circuit substrate 20, where the conductive terminals 160 of the semiconductor package 10 are in direct contact with the circuit substrate 20 so that the semiconductor package 10 and the circuit substrate 20 are electrically connected. In some embodiments, a reflow process is performed on the conductive terminals 160 to enhance electrical and mechanical connections between the circuit substrate 20 and the semiconductor package 10.

Figure 5:
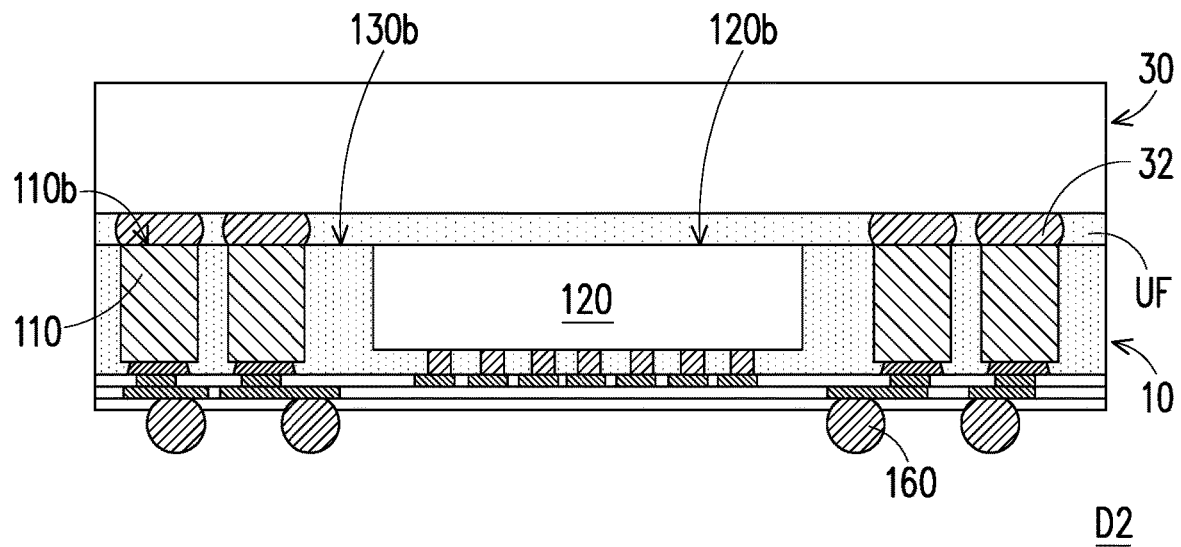
FIG. 5 is a schematic cross-sectional view illustrating an integrated semiconductor package according to an embodiment of the disclosure.

FIG. 5 is a schematic cross-sectional view illustrating an integrated semiconductor package according to an embodiment of the disclosure. Referring to FIG. 5, a semiconductor device 30 is disposed on the semiconductor chip 120 to form an integrated semiconductor package D2. For example, after removing the temporary carrier 50 as shown in FIG. 1H, the second side 120b of the semiconductor chip 120, the second surfaces 110b of the conductive elements 110, and the second surface 130b of the insulating encapsulation 130 are exposed. The semiconductor device 30 is then placed on the semiconductor chip 120, where external connectors 32 of the semiconductor device 30 are in contact with the second surfaces 110b of the conductive elements 110. The semiconductor device 30 is electrically connected to the conductive elements 110. A reflow process may be performed on the external connectors 32 to enhance electrical and mechanical connections between the semiconductor device 30 and the semiconductor package 10. An underfill UF is optionally formed in the gap between the semiconductor device 30 and the semiconductor package 10 to stiffen the integrated semiconductor package D2 and protect the external connectors 32 from flexural damage.

The semiconductor device 30 may be an IC package, a memory device, or other suitable semiconductor devices. Since the semiconductor device 30 is stacked over and is electrically connected to the semiconductor package 10, the integrated semiconductor package D2 having multiple packages stacked upon one another to provide additional functionality may be referred to as a package-on-package (POP) structure. The integrated semiconductor package D2 may be disposed on the circuit substrate 20 (shown in FIG. 4) to form an electronic assembly (not shown). Other components (e.g., heat sink) may be added to the semiconductor package 10 to provide additional functionality. The application of the semiconductor package 10 is not limited in the disclosure.

Figure 6A:
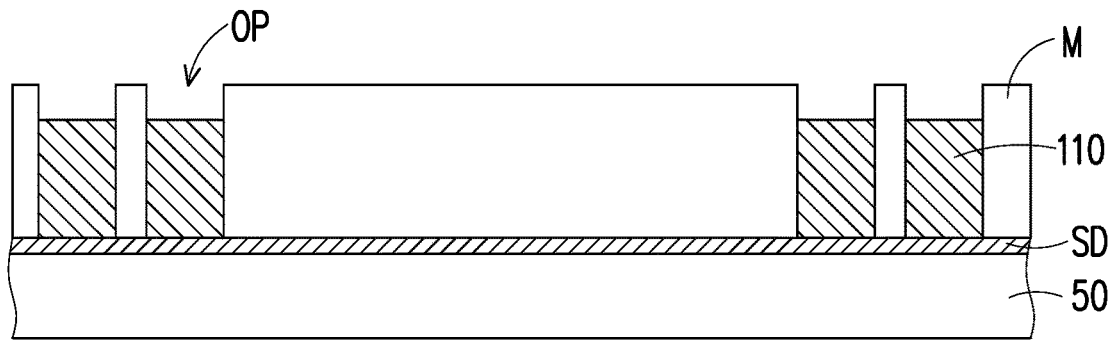
FIG. 6A-6C are schematic cross-sectional views illustrating a manufacturing method of a semiconductor package according to an embodiment of the disclosure.
Figure 6B:
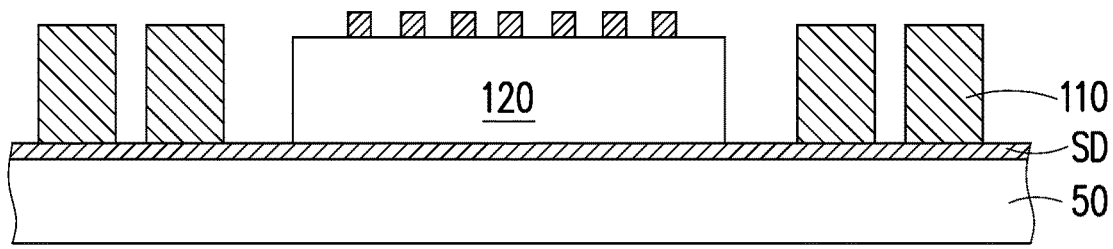
Figure 6C:
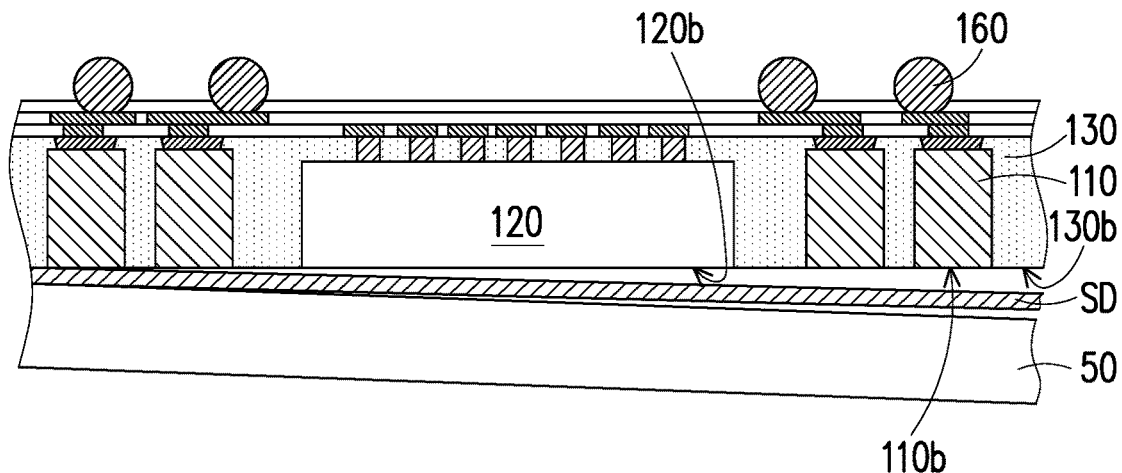

FIG. 6A to 6C are schematic cross-sectional views illustrating a manufacturing method of a semiconductor package according to an embodiment of the disclosure. The manufacturing method of the present embodiment is similar to the embodiment illustrated in FIG. 1A to FIG. 1H. The difference includes that the conductive elements 110 is formed on a seed layer SD. Referring to FIG. 6A first, the seed layer SD is formed over the temporary carrier 50 by a deposition process, a plating process, or other suitable process. The seed layer SD may be a single conductive layer or a composite layer including several sub-layers of different materials (e.g., titanium/copper layer). Subsequently, a patterned mask layer M having a plurality of openings OP is formed over the seed layer SD. Next, a conductive material is formed in the openings OP of the patterned mask layer M to be in direct contact with the seed layer SD using a plating process, or other suitable deposition process.

Referring to FIG. 6B, after forming the conductive material, the patterned mask layer M is removed to form a plurality of the conductive elements 110 on the seed layer SD. Next, the semiconductor chip 120 is disposed on the seed layer SD and surrounded by the conductive elements 110. The height of the semiconductor chip 120 is greater than the height of the conductive element 110. When the conductive elements 110 and/or the conductive via and the patterned conductive layer of the redistribution structure subsequently are subsequently formed, the seed layer SD may carry the electrical plating current from the periphery of the wafer (where electrical contact is made) to those openings and via holes located across the wafer surface so that the conductive material can be plated in those openings and via holes. After disposing the semiconductor chip 120, the insulating material is formed on the seed layer SD and later formed as the insulating encapsulation. The subsequent processes may be similar as described in FIG. 1C to FIG. 1G, and the detailed descriptions are omitted for brevity.

Referring to FIG. 6C, after forming the conductive terminals 160, the temporary carrier 50 and the seed layer SD are removed to expose the second side 120b of the semiconductor chip 120, the second surfaces 110b of the conductive elements 110, and the second surface 130b of the insulating encapsulation 130. In some embodiments, the temporary carrier 50 is removed prior to the seed layer SD.

Figure 7A:
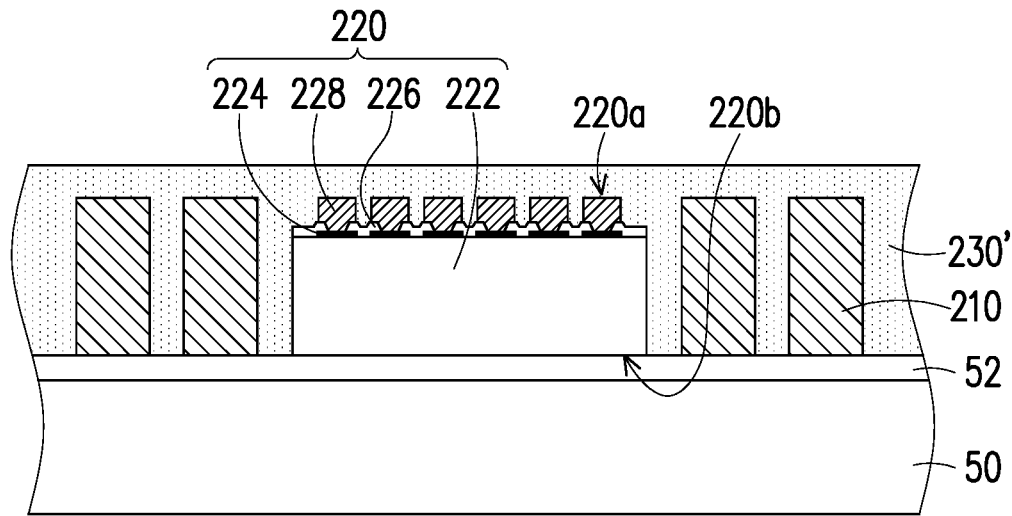
FIG. 7A-7H are schematic cross-sectional views illustrating a manufacturing method of a semiconductor package according to an embodiment of the disclosure.
Figure 7B:
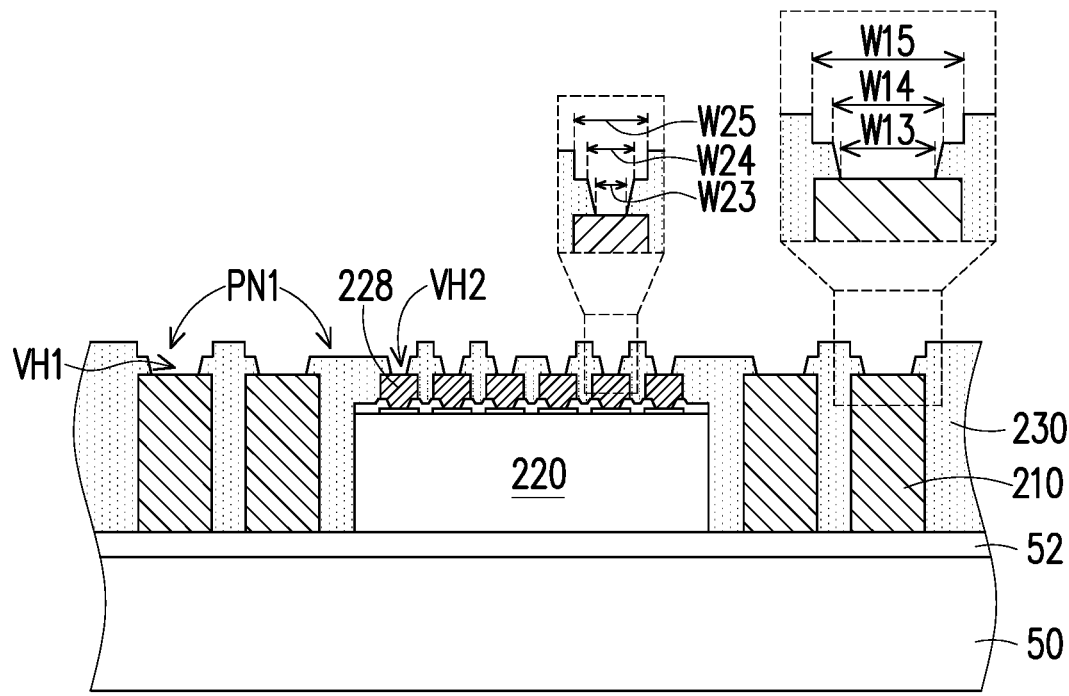
Figure 7C:
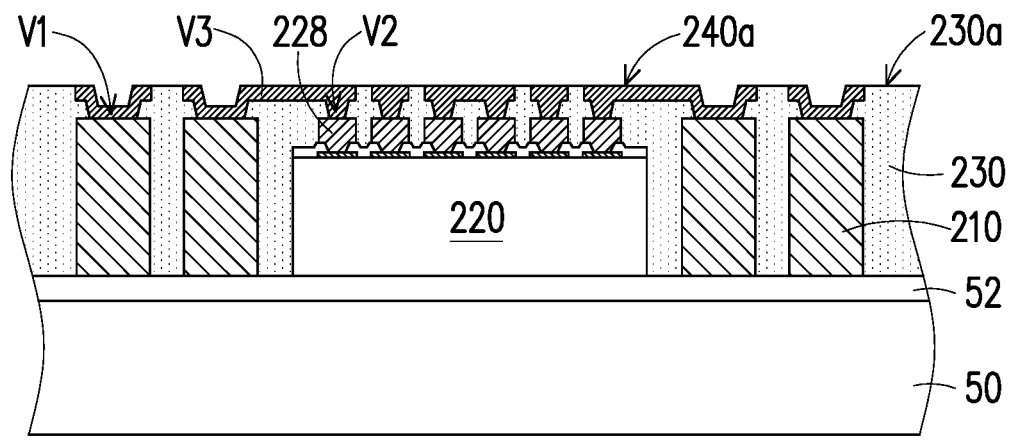
Figure 7D:
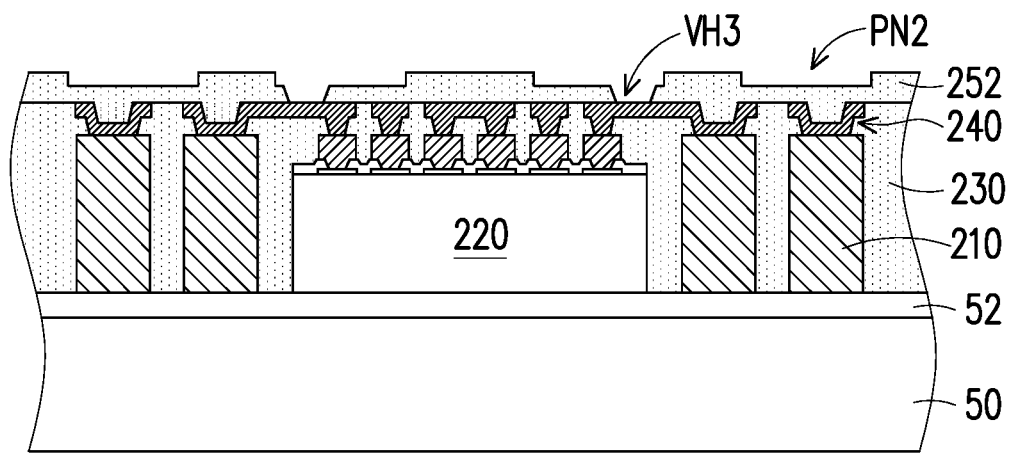
Figure 7E:
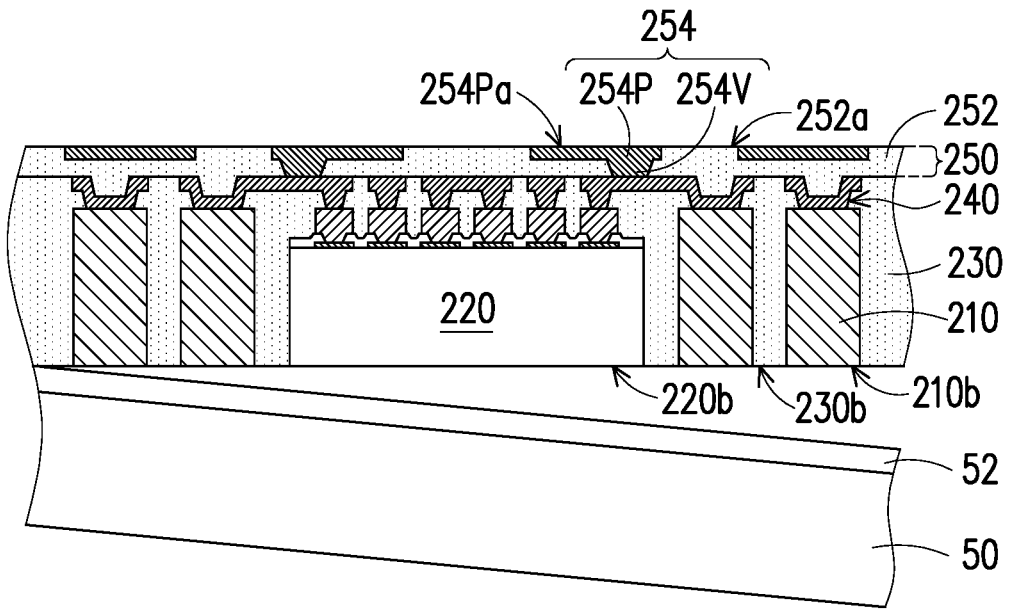
Figure 7F:
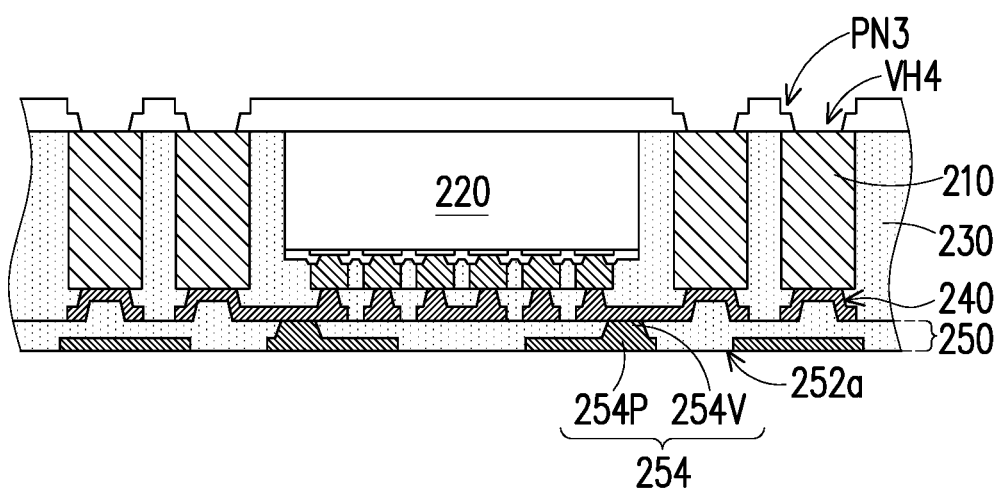
Figure 7G:
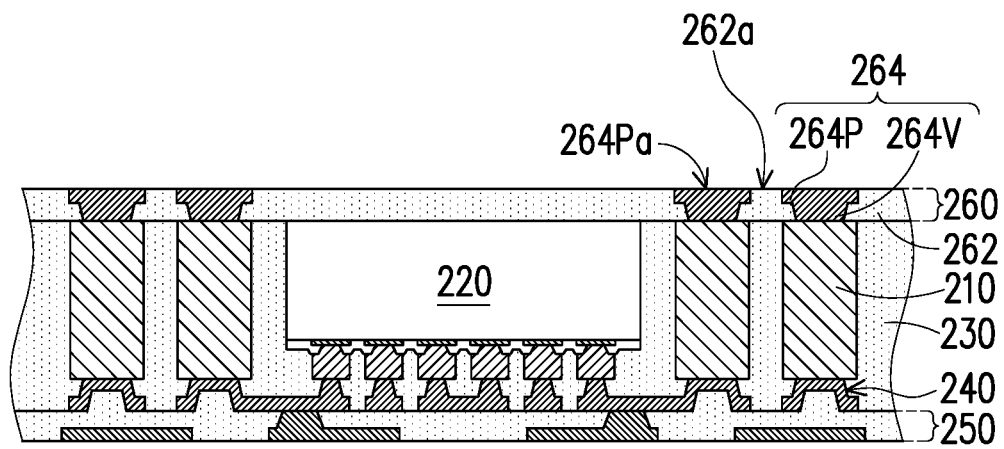
Figure 7H:
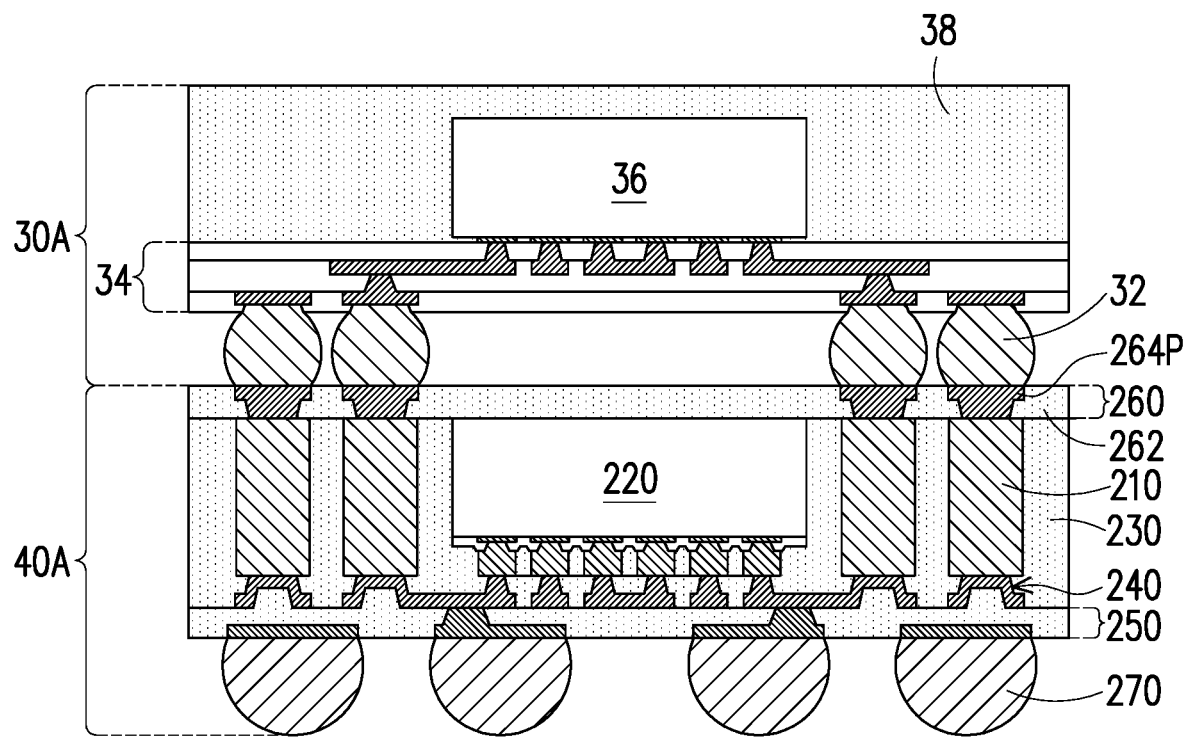

FIGS. 7A and 7H are schematic cross-sectional views illustrating a manufacturing method of a semiconductor package according to an embodiment of the disclosure. Referring to FIG. 7A, an insulating material 230' is formed on the temporary carrier 50 to encapsulate a semiconductor chip 220 and a conductive element 210. The temporary carrier 50 is provided with a de-bonding layer 52 for the releasibility of the structure formed thereon in the subsequent processes. The conductive element 210 may be formed by lithography and plating processes. In some embodiments, the conductive element 210 are pre-formed (e.g., by etching conductive frame to form a plurality of conductive pillars) and may be placed on the de-bonding layer 52 such that the lithography and plating processes can be omitted, thereby saving manufacturing cost. The semiconductor chip 220 is placed on the de-bonding layer 52. The semiconductor chip 220 is placed to be surrounded by the conductive elements 210. The forming/disposing sequence of the semiconductor chip 220 and the conductive element 210 construe no limitation in the disclosure.

The semiconductor chip 220 may be similar to the semiconductor chip 120 described above, and the details are simplified for brevity. In some embodiments, the semiconductor chip 220 include a semiconductor substrate 222, connecting pads 224 distributed on the semiconductor substrate 222, a passivation layer 224 disposed on the semiconductor substrate 222 and having openings to expose at least a portion of the connecting pads 224, and conductive bumps 228 disposed in the openings of the passivation layer to connect the connecting pads 224. The semiconductor substrate 222 may include integrated components (e.g., active and/or passive components, interconnection structure, etc.) formed therein. The connecting pads 224 may be electrically connected to the integrated components in the semiconductor substrate 222. For example, the connecting pads 224 include aluminum pads, copper pads or the like. The conductive bumps 228 disposed on the connecting pads 224 may be copper posts. The side of the semiconductor chip 220 where the conductive bumps 228 are disposed may be considered as a first side 220a. A second side 220b of the semiconductor chip 220 opposite to the first side may be bonded to the temporary carrier 50 through the de-bonding layer 52.

The insulating material 230' may be similar to the insulating material 130' described above, and the details are simplified for brevity. In some embodiments, the insulating material 230' is formed so that the conductive elements 210 and the semiconductor chip 220 are over-molded. For example, the thickness of the insulating material 230' is greater than a height of the conductive element 210 and also greater than a thickness of the semiconductor chip 220. The height of the conductive element 210 and the thickness of the semiconductor chip 220 may depend on the design requirements, and construe no limitation in the disclosure.

Referring to FIG. 7B and FIG. 7C, a portion of the insulating material 230' is removed to form an insulating encapsulation 230. For example, the insulating encapsulation 230 is formed to include a first via hole VH1 exposing at least a portion of the conductive elements 210, a second via hole VH2 exposing at least a portion of conductive bumps 228, and a first pattern PN1 in communication with the first via hole VH1 and the second via hole VH2. A portion of the insulating material 230' is removed by drilling process, lithography and etching processes, r other suitable removing process. For example, a laser drilling process is performed on the insulating material 230' to form different types of drilling depths. The first via hole VH1 and/or the second via hole VH2 may have a tapered profile. For example, a bottom diameter W13 of the first via hole VH1 may be smaller than a top diameter W14 of the first via hole VH1. Similarly, a bottom diameter W23 of the second via hole VH2 may be smaller than a top diameter W24 of the second via hole VH2. The dimension of the second via hole VH2 may be smaller or finer than that of the first via hole VH1. The first pattern PN1 may be formed in the form of a trench over the first via hole VH1 and the second via hole VH2. For example, the trench of the first pattern PN1 over the first via hole VH1 includes a first width W15 wider than the top diameter W14 of the first via hole VH1. The trench of the first pattern PN1 over the second via hole VH2 includes a second width W25 wider than the top diameter W24 of the second via hole VH2. However, the dimensions of the first via hole VH1, the second via hole VH2, and the first pattern PN1 may depend on the circuit design, and construe no limitation in the disclosure.

Subsequently, a conductive material (e.g., copper, gold, aluminum, metal alloy, or combinations thereof, or the like) may be formed in the first via hole VH1, the second via hole VH2, and the first pattern PN1 to form an interconnecting circuitry 240 including a first conductive via V1, a second conductive via V2, and a conductive pattern V3, as illustrated in FIG. 7C. For example, the conductive material may be formed by using a plating process or other suitable deposition processes. The conductive material may be deposited in the first via hole VH1, the second via hole VH2, and the first pattern PN1 during the same process. The second via hole VH2 may be filled by the conductive material, whilst the first via hole VH1 having a greater dimension than the second via hole VH2 may be partially filled by the conductive material. For example, the first conductive via V1 is conformally covered the first via hole VH1. In alternative embodiments, the first conductive via V1 and the second conductive via V2 are formed in the form of pillars.

After forming the conductive material, the interconnecting circuitry 240 may be inlaid in the insulating encapsulation 230 and may be in electrical and physical contact with the conductive elements 210 and the conductive bumps 228 of the semiconductor chip 220. The semiconductor chip 220 may be electrically coupled to the conductive elements 210 though the interconnecting circuitry 240. In some embodiments, the interconnecting circuitry 240 may be viewed as a redistribution circuitry. Since the interconnecting circuitry 240 is embedded in the insulating encapsulation 230, conventional lithography techniques for forming redistribution layer (RDL) to connect the conductive elements 210 and the semiconductor chip 220 may be omitted, thereby reducing the manufacturing cost. In other embodiments, after forming the conductive material, an excess of the conductive material may be removed and planarized. In other embodiments, a portion of a top surface 240a of the interconnecting circuitry 240 is substantially coplanar with a top surface 230a of the insulating encapsulation 230.

Referring to FIG. 7D and FIG. 7E, a first circuit structure 250 including a first insulating layer 252 and a first conductive feature 254 may be formed on the interconnecting circuitry 240 and the insulating encapsulation 230. For example, after forming the interconnecting circuitry 240, an insulating material may be formed over the interconnecting circuitry 240 and the insulating encapsulation 230. The insulating material may be a dry film formed by limitation or sheet molding compounds formed by molding. Other suitable electrically insulating materials and other suitable forming process may be utilized to form the insulating material. Next, a portion of the insulating material is removed to form the first insulating layer 252 including a plurality of feature pattern (e.g., third via hole VH3 and second pattern PN2 in communication with the third via hole VH3). The removing process may be similar to the removing described in FIG. 7B, and the details are simplified for brevity. At least a portion of the interconnecting circuitry 240 may be revealed by the feature pattern (e.g., third via hole VH3 and second pattern PN2) of the first insulating layer 252 for further electrical connection.

Subsequently, a conductive material may be formed in the third via hole VH3 and the second pattern PN2 of the first insulating layer 252 such that the first conductive feature 254 including a third conductive via 254V and a conductive pattern 254P is formed. In some embodiments, the above-mentioned steps may be performed multiple times to obtain a multi-layered circuit structure as required by the circuit design. The third conductive via 254V may be in electrical and physical contact with the underlying interconnecting circuitry 240, and the conductive pattern 254P may be formed on the third conductive via 254V. The first conductive feature 254 may be inlaid in the first insulating layer 252. In some embodiments, the conductive pattern 254P includes ball pads for a subsequent ball-mounting process. Top surfaces 254 Pa of the conductive pattern 254P (e.g., opposite to the insulating encapsulation 230) may be substantially coplanar with a top surface 252a of the first insulating layer 252.

Continue to FIG. 7E, after forming the first circuit structure 250, the temporary carrier 50 may be removed. For example, the external energy such as UV laser, visible light or heat, may be applied to the de-bonding layer 52 so that the temporary carrier 50 may be removed to expose the second side 220b of the semiconductor chip 220, the second surface 210b of the conductive elements 210, and the second surface 230b of the insulating encapsulation 230. Subsequently, the structure is optionally flipped upside down for performing subsequent processes on the second side 220b of the semiconductor chip 220.

Referring to FIG. 7F and FIG. 7G, a second circuit structure 260 including a second insulating layer 262 and a second conductive feature 264 may be formed on the second side 220b of the semiconductor chip 220, the second surface 210b of the conductive elements 210, and the second surface 230b of the insulating encapsulation 230 for stacking another package/device. The materials and forming process of the second circuit structure 260 may be similar to that of the first circuit structure 250, and the details are simplified for brevity. In some embodiments, the second insulating layer 262 includes a plurality of feature pattern (e.g., fourth via hole VH4 and third pattern PN3 in communication with the fourth via hole VH4) exposing at least a portion of the second surface 210b of the conductive elements 210. In certain embodiments, the second insulating layer 262 of the second circuit structure 260, the first insulating layer 252 of the first circuit structure 250, and the insulating encapsulation 250 may use the same insulating material to better control the warpage of the structure, thereby improving the reliability of semiconductor package. In certain embodiments, both of the feature patterns of the second insulating layer 262 and the first insulating layer 252 are formed by a laser drilling process instead of lithography and etching processes.

The second conductive feature 264 including a fourth conductive via 264V and a conductive pattern 264P may be formed in the fourth via hole VH4 and the third pattern PN3. The second conductive feature 264 may be in electrical and physical contact with the conductive elements 210. In some embodiments, the second conductive feature 264 is inlaid in the second insulating layer 262. The conductive pattern 264P may include ball pads for a subsequent ball-mounting process. Top surfaces 264 Pa of the conductive pattern 264P (e.g., opposite to the insulating encapsulation 230) may be substantially coplanar with a top surface 262a of the second insulating layer 262. It should be appreciated that the second circuit structure 260 may include more than one second insulating layer 262 and multiple second conductive features 264 embedded in the second insulating layer 262 based on the circuit design requirements.

Referring to FIG. 7H, after forming the second circuit structure 260, a semiconductor device 30A may be disposed on the second circuit structure 260. The semiconductor device 30A may be similar to the semiconductor device 30 described in FIG. 5, and the details are simplified for brevity. The semiconductor device 30A may include the external connectors 32 in contact with the second conductive feature 264 of the second circuit structure 260, a redistribution structure 34 disposed over the external connectors 32, a semiconductor die 36 (e.g., including active and/or passive components, or other IC components built therein) electrically connected to the redistribution structure 34, and an encapsulant 28 disposed on the redistribution structure and covering the semiconductor die 36 for protection. The semiconductor die 36 of the semiconductor device 30A may be electrically coupled to the semiconductor chip 220 through, for example, the redistribution structure 34, external connectors 32, the second circuit structure 260, the conductive elements 210, and the interconnecting circuitry 240.

In some embodiments, a conductive terminal 270 is subsequently formed on the first circuit structure 250 for further electrical connection. The conductive terminal 270 may be similar to the conductive terminal 160 described in FIG. 1G, and the details are omitted for brevity. In some embodiments, the underlying structure of the semiconductor device 30A may be viewed as a semiconductor package 40A. In some embodiments, aforementioned steps are performed at wafer level or at panel level. Afterwards, as shown in FIG. 7H, a singulation process may be performed to form a plurality of semiconductor device D3 including the semiconductor package 40A and the semiconductor device 30A stacked thereon. In certain embodiments, the semiconductor package 40A may be manufactured without using conventional lithography and etching processes to form redistribution layers such that the manufacturing coast may be reduced.

Figure 8:
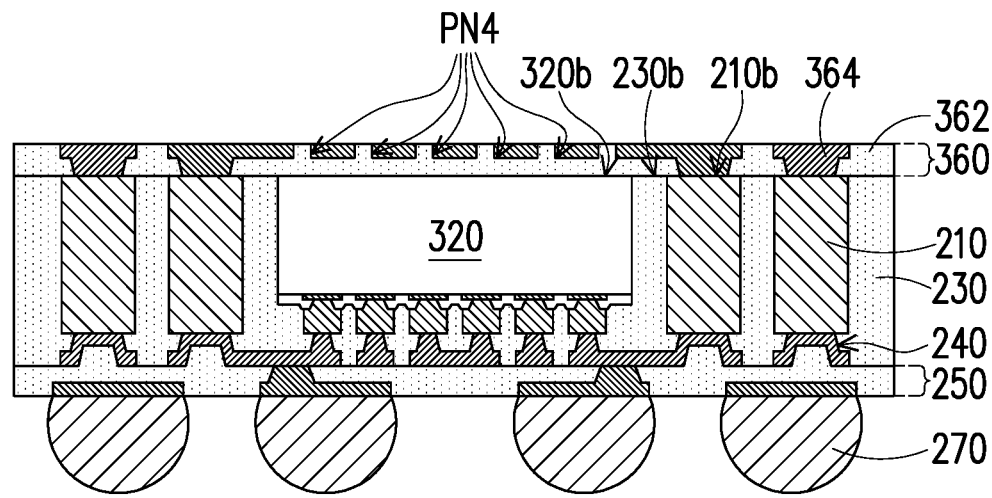
FIG. 8 is schematic cross-sectional views illustrating a semiconductor package according to an embodiment of the disclosure.

FIG. 8 is schematic cross-sectional views illustrating a semiconductor package according to an embodiment of the disclosure. A semiconductor package 40B illustrated in FIG. 8 may be similar to the semiconductor package 40A illustrated in FIG. 7H. The identical or similar numbers refer to the identical or similar elements, so detail thereof is not repeated. Referring to FIG. 8, the semiconductor package 40B including a semiconductor chip 320, the conductive element 210, the interconnecting circuitry 240, the insulating encapsulation 230, the first circuit structure 250, the conductive terminal 270, and an antenna structure 360. The semiconductor chip 320 may be a radio frequency (RF) chip or a WiFi chip including both of RF and digital chips to electrically couple to the antenna structure 360. Other types or functions of semiconductor chip(s) may be utilized. The antenna structure 360 may be formed on the second side 320b of the semiconductor chip 320, the second surface 210b of the conductive elements 210, and the second surface 230b of the insulating encapsulation 230. In some embodiments, the antenna structure 360 includes a third insulating layer 362 and an antenna feature 364 inlaid in the third insulating layer 362. The forming methods of the antenna structure 360 may be similar to that of the second circuit structure 260. The difference includes that the third insulating layer 362 includes additional pattern PN4 corresponding to the semiconductor chip 320. For example, the conductive material may fill in the third insulating layer 362 (e.g., pattern PN4 and PN3/VH3 as shown in FIG. 7F) to form the antenna feature 364 for antenna application. For example, the antenna feature 364 formed right on the semiconductor chip 320 may include patch antenna. Other types of antenna may be applied based on the requirements.

Figure 9:
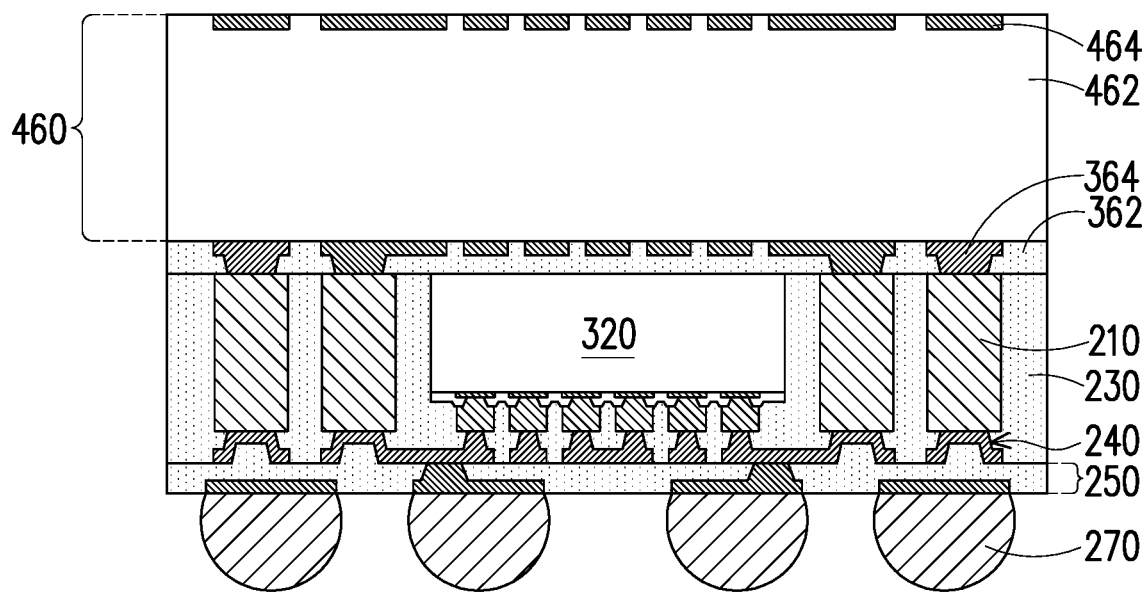
FIG. 9 is schematic cross-sectional views illustrating a semiconductor package according to an embodiment of the disclosure.

FIG. 9 is a schematic cross-sectional view illustrating a semiconductor package according to an embodiment of the disclosure. A semiconductor package 40C illustrated in FIG. 9 may be similar to the semiconductor package 40B illustrated in FIG. 8, and the identical or similar numbers refer to the identical or similar elements, so detail thereof is not repeated. The difference between the semiconductor package 40C and the semiconductor package 40B includes an antenna structure 460. Referring to FIG. 9, the antenna structure 460 of the semiconductor package 40C including the third insulating layer 362, the antenna feature 364 embedded in the third insulating layer 362, a dielectric layer 462 disposed on the third insulating layer 362 opposite to the insulting encapsulation 230, and a coupling feature 464 inlaid in the dielectric layer 462 and electrically coupled to the antenna feature 364.

The forming processes of the dielectric layer 462 and the coupling feature 464 may be similar to as that of the third insulating layer 362 and the antenna feature 364. In some embodiments, the dielectric layer 462 has low dielectric constant and low loss tangent properties. Other suitable materials may be utilized depending on the frequency range of high-speed applications and the required electrical properties of the semiconductor package 40C.

Based on the above, the semiconductor package includes the conductive via formed on the conductive element and embedded in the insulating encapsulation so that the surface of the conductive element and the active surface of the semiconductor chip are not at the same level, thereby facilitating the efficiency of insulating material's thinning process and improving the processing yield. In addition, the pitch between two adjacent conductive vias can be adjusted to meet the fine-pitch requirements of the redistribution structure, thereby achieving the high density connections. Furthermore, multiple semiconductor packages may be stacked upon one another to provide additional functionality to form a POP structure. In addition, the semiconductor package can be mounted on other electronic device so as to open the possibility to various package designs. Moreover, the interconnecting circuitry may be embedded in the insulating encapsulation to be in electrical contact with the semiconductor chip and the conductive element such that a photo-lithography process for forming a redistribution layer connected therebetween may be omitted, thereby saving manufacturing cost.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor package, comprising:
a semiconductor chip having a first side and a second side opposite the first side;
a conductive element disposed aside the semiconductor chip and having a first surface and a second surface opposite the first surface;
a conductive via disposed on and electrically connected to the conductive element and having a first via surface and a second via surface opposite the first via surface;
an insulating encapsulation encapsulating the semiconductor chip, the conductive element, and the conductive via; and
a first circuit structure disposed on the semiconductor chip and the conductive via, wherein the conductive via is located between the first circuit structure and the conductive element, and the semiconductor chip is electrically coupled to the conductive via through the first circuit structure, wherein:
the first side of the semiconductor chip facing toward the first circuit structure comprises a plurality of conductive bumps;
the second surface of the conductive element is coplanar with the second side of the semiconductor chip;
each conductive bump has a first bump surface facing away from the semiconductor chip and a second bump surface facing toward the semiconductor chip;
a height measured from the first surface of the conductive element to the second surface of the conductive element is less than a height measured from the first bump surface of one of the conductive bumps to the second side of the semiconductor chip; and
a height measured from the first via surface to the second via surface of each conductive via is shorter than a height measured from the first bump surface to the second bump surface of one of the conductive bumps.

2. The semiconductor package according to claim 1, wherein the conductive element comprises a first region and a second region connected to the first region, the conductive via is connected to the conductive element corresponding to the first region, and the insulating encapsulation covers the surface of the second region of the conductive element.

3. The semiconductor package according to claim 1, wherein a first surface of the conductive via is connected to the first circuit structure, a second surface of the conductive via opposite to the first surface of the conductive via is connected to the conductive element, a width of the first surface of the conductive via is wider than a width of the second surface of the conductive via.

4. The semiconductor package according to claim 1, wherein a total height measured from the first via surface of the conductive via to the second surface of the conductive element is substantially equal to the height measured from the first bump surface of one of the conductive bumps to the second side of the semiconductor chip.

5. The semiconductor package according to claim 1, wherein the semiconductor package comprises:
a plurality of the conductive vias, and
a plurality of the conductive elements surrounding the semiconductor chip, wherein each of the conductive vias is disposed on one of the conductive elements, and a pitch between the adjacent conductive elements is greater than a pitch between the adjacent conductive vias.

* * * * *